(12) United States Patent
Hiraide (10) Patent No.: US 11,450,707 B2
(45) Date of Patent: Sep. 20, 2022

(54) LIGHT EMISSION DEVICE

(71) Applicant: NICHIA CORPORATION, Anan (JP)

(72) Inventor: Noriaki Hiraide, Suwa-gun (JP)

(73) Assignee: NICHIA CORPORATION, Anan (JP)

(*) Notice: Subject to any disclaimer, the term of this patent is extended or adjusted under 35 U.S.C. 154(b) by 85 days.

(21) Appl. No.: 16/944,766

(22) Filed: Jul. 31, 2020

(65) Prior Publication Data

US 2021/0036050 A1 Feb. 4, 2021

(30) Foreign Application Priority Data

Aug. 2, 2019 (JP) .............................. JP2019-143125

(51) Int. Cl.
| | | |
|---|---|---|
| *H01L 27/15* | (2006.01) | |
| *H01L 33/48* | (2010.01) | |
| *H01L 33/62* | (2010.01) | |
| *H01L 33/60* | (2010.01) | |
| *H01L 33/50* | (2010.01) | |

(52) U.S. Cl.
CPC .......... *H01L 27/156* (2013.01); *H01L 33/486* (2013.01); *H01L 33/50* (2013.01); *H01L 33/60* (2013.01); *H01L 33/62* (2013.01)

(58) Field of Classification Search
None
See application file for complete search history.

(56) References Cited

U.S. PATENT DOCUMENTS

| | | | |
|---|---|---|---|
| 9,678,383 | B1 | 6/2017 | Peterson et al. |
| 2011/0037740 | A1 | 2/2011 | Yamaguchi |
| 2011/0149594 | A1 | 6/2011 | Terajima et al. |
| 2013/0242604 | A1 | 9/2013 | Kim et al. |
| 2017/0269430 | A1* | 9/2017 | Peterson ............ G02F 1/133606 |
| 2020/0117055 | A1* | 4/2020 | Kim .................. G02F 1/133606 |

FOREIGN PATENT DOCUMENTS

| | | |
|---|---|---|
| JP | 61-56388 A | 3/1986 |
| JP | 2-118959 U | 9/1990 |
| JP | 2005-10436 A | 1/2005 |
| JP | 2005-18997 A | 1/2005 |
| JP | 2007-18936 A | 1/2007 |

(Continued)

*Primary Examiner* — Robert K Carpenter (74) *Attorney, Agent, or Firm* — Birch, Stewart, Kolasch & Birch, LLP (57) ABSTRACT

A light emission device includes: a wiring board; a plurality of light-emitting elements being disposed on the wiring board and electrically connected to a wiring layer of the wiring board; a first light diffusing member being disposed on the wiring board, the first light diffusing member having a plurality of throughholes and containing a light-diffusive material, each of the plurality of light-emitting elements being disposed in a corresponding one of the plurality of throughholes; a plurality of second light diffusing members covering the plurality of light-emitting elements and being disposed in the plurality of throughholes, each second light diffusing member containing a light-diffusive material, such that a content ratio of the light-diffusive material in each second light diffusing member is higher than a content ratio of the light-diffusive material in the first light diffusing member; and a wavelength converting member.

10 Claims, 8 Drawing Sheets

(56) References Cited

FOREIGN PATENT DOCUMENTS

| | | |
|---|---|---|
| JP | 2007-227286 A | 9/2007 |
| JP | 2008-59786 A | 3/2008 |
| JP | 2010-3941 A | 1/2010 |
| JP | 2010-8837 A | 1/2010 |
| JP | WO 2010/070885 A1 | 6/2010 |
| JP | 2011-204566 A | 10/2011 |
| JP | 2011-210674 A | 10/2011 |
| JP | 2011-211085 A | 10/2011 |
| JP | 2012-195350 A | 10/2012 |
| JP | 2012-212532 A | 11/2012 |
| JP | 2014-502011 A | 1/2014 |
| JP | 2019-513300 A | 5/2019 |
| WO | WO 2007/105671 A1 | 9/2007 |

\* cited by examiner

LIGHT EMISSION DEVICE

CROSS-REFERENCE TO RELATED APPLICATION

This application claims priority to Japanese Patent Application No. 2019-143125, filed on Aug. 2, 2019, the disclosure of which is hereby incorporated by reference in its entirety.

BACKGROUND

The present disclosure relates to a light emission device.

Thin-profiled light emission devices that include a plurality of light-emitting elements arranged in a two-dimensional array have been developed in the recent years. A thin-profiled light emission device may be adopted as a direct-type backlight for use in a display device such as a liquid crystal display device. Japanese Laid-Open Patent Publication No. 2011-204566 and Japanese Laid-Open Patent Publication No. 2011-210674 each disclose a light emission device including: a light guide plate having throughholes; and a plurality of light-emitting diode (LED) devices that are mounted on a mounting substrate via flip-chip bonding. Each of the plurality of light-emitting diode devices is covered by a sealing material, and is disposed within a corresponding throughhole.

SUMMARY

Light emission devices are expected to be thinner in profile and smaller in size. An illustrative embodiment of the present disclosure provides a light emission device which suppresses unevenness in the luminance of light that is emitted from a light source and which can be made thinner in profile and smaller in size.

In a non-limiting illustrative embodiment, a light emission device according to the present disclosure includes: a wiring board; a plurality of light-emitting elements being disposed on the wiring board and electrically connected to a wiring layer of the wiring board; a first light diffusing member being disposed on the wiring board, the first light diffusing member having a plurality of throughholes and containing a light-diffusive material, each of the plurality of light-emitting elements being disposed in a corresponding one of the plurality of throughholes; a plurality of second light diffusing members covering the plurality of light-emitting elements and being disposed in the plurality of throughholes, each second light diffusing member containing a light-diffusive material, such that a content ratio of the light-diffusive material in each second light diffusing member is higher than a content ratio of the light-diffusive material in the first light diffusing member; and a wavelength converting member disposed on the first light diffusing member and the plurality of second light diffusing members.

According to an illustrative embodiment of the present disclosure, there is provided a novel light emission device which suppresses unevenness in the luminance of light that is emitted from a light source and which can be made thinner in profile and smaller in size.

DETAILED DESCRIPTION

Hereinafter, with reference to the drawings, embodiments of the present disclosure will be described in detail. The following embodiments are only exemplary, and the light emission devices according to the present disclosure are not limited to the following embodiments. For example, numerical values, shapes, materials, steps, and orders of steps, etc., that are indicated in the following embodiments are only exemplary, and admit of various modifications so long as it makes technological sense. The embodiments described below are only exemplary, and can be combined in a variety of manners so long as it makes technological sense to do so.

Note that the dimensions, shapes, etc. of any component elements shown in a drawing may be exaggerated for ease of understanding, and thus may not strictly reflect their dimensions, shapes, and relative sizes between component elements in an actual light emission device. In order to avoid excessive complexity of the drawings, certain elements may be omitted from illustration.

In the following description, component elements having substantially identical functions may be denoted by identical reference numerals, with their description being omitted. In the following description, terms indicating specific directions or positions (e.g., "upper", "above", "over", "lower", "below", "under", "right", and "left", or any other terms of which these are parts) may be used. These terms are merely being used to indicate relative directions or positions in the drawing under attention, in a manner that provides easy understanding. So long as the relative directions or positions as indicated by terms such as "above", "below", etc., in the drawing under attention are conserved, any drawing employed outside the present disclosure, actually manufactured products, production apparatuses, or the like may not adhere to the same exact positioning as that indicated in the drawing under attention. In the present disclosure, the notion "parallel" encompasses any two straight lines, sides, faces, etc., making an angle within about ±5° of 0°, unless otherwise specified. In the present disclosure, the notion "perpendicular" or "orthogonal" encompasses any two straight lines, sides, faces, etc., making an angle within about ±5° of 90°, unless otherwise specified.

[1. Structure of Light Emission Device 100]

Figure 1:
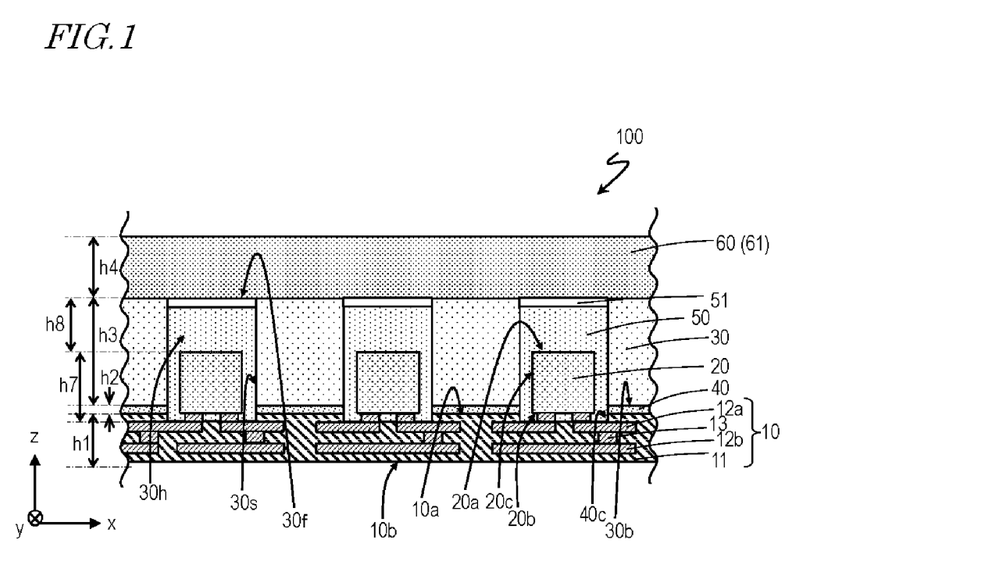
FIG. 1 is a schematic cross-sectional view showing an example structure of a light emission device 100 according to an embodiment structure.

FIG. 1 is a cross-sectional view showing an example structure of a light emission device 100 according to the present embodiment. In the figure is shown a three-dimensional coordinate system based on the three orthogonal axes of an x axis, a y axis, and a z axis. In any other drawing attached herein, a similar three-dimensional coordinate system is shown, where the x axis, y axis, and the z axis always indicate respectively identical orientations throughout the drawings.

The light emission device 100 includes a wiring board 10, a plurality of light-emitting elements 20, a first light diffusing member 30, a first light reflecting layer 40, a plurality of second light diffusing members 50, a third light reflecting layer 51, and a wavelength converting member 61. A typical exemplary shape of the light emission device 100 may essentially be a rectangle in plan view. For example, the thickness (i.e., height along the z direction) of the light emission device 100 may be not less than 0.5 mm and not more than 0.8 mm. Hereinafter, respective component elements will be described in detail.

(Wiring Board 10)

The wiring board 10 has an upper face 10a and a lower face 10b. The plurality of light-emitting elements 20 are disposed and supported on the upper face 10a of the wiring board 10. The wiring board 10 includes a first conductor wiring layer 12a, a second conductor wiring layer 12b, and an insulating layer 11, such that the plurality of light-emitting elements 20 are electrically connected to the first conductor wiring layer 12a. The first conductor wiring layer 12a and the second conductor wiring layer 12b are electrically insulated by the insulating layer 11, and are electrically connected by way of vias 13. Within the upper face 10a of the wiring board 10, any portion other than the regions where the light-emitting elements 20 are mounted is covered by the insulating layer 11.

An example of the wiring board 10 is a flexible printed wiring board (FPC) which is capable of being fabricated by roll-to-roll method. An FPC includes a film-shaped electrical insulator (resin) and a conductor wiring layer made of e.g. copper. Examples of resin materials include phenolic resins, epoxy resins, polyimide resins, BT resins, polyphthalamide (PPA), polyethylene terephthalate (PET), and the like. The thickness of the wiring board 10 may be appropriately chosen. In the present embodiment, the thickness h1 (i.e., height along the z direction in the figure) may be e.g. about 0.195 mm. By adopting an FPC, the wiring board 10 can be made light-weight and thin-profiled.

From the standpoints of thermal resistance and light fastness, ceramics may be chosen as the material of the wiring board 10; in that case, the wiring board 10 is a rigid substrate. The rigid substrate is preferably a thin-profiled rigid substrate that is capable of being flexed. Examples of ceramics include alumina, mullite, forsterite, glass ceramics, nitride-based ceramics (e.g., AlN), carbide-based ceramics (e.g., SiC), LTCC (Low Temperature Co-fired Ceramics), and the like, for example.

Moreover, the wiring board 10 may be made of a composite material. Specifically, inorganic fillers such as glass fibers, $SiO_2$, $TiO_2$, or $Al_2O_3$ may be mixed in the aforementioned resins. Examples may be fiberglass-reinforced plastics (glass epoxy resins) and the like. This allows for improved mechanical strength of the wiring board 10, reduction in the coefficient of thermal expansion, and improved light reflectance. Furthermore, the wiring board 10 may at least be electrically insulative in its upper face 10a, and may have a multilayer structure.

The first conductor wiring layer 12a is provided at the upper face 10a side of the wiring board 10. The first conductor wiring layer 12a includes a wiring pattern(s) for supplying power to the plurality of light-emitting elements 20 from an external control circuit (not shown). The material of the conductor wiring layer may be appropriately chosen, depending on the material, production method, etc., of the conductor wiring layer. For example, in the case where an epoxy resin is used as the material of the wiring board 10, a material which permits easy processing may preferably be chosen as the material of the conductor wiring layer. For example, a metal layer of copper, nickel, or the like which has been formed through plating, sputtering, vapor deposition, or attachment via pressing can be used as the conductor wiring layer. The metal layer may be processed into a predetermined wiring pattern, with masking by way of printing, photolithography, etc., and etching. By coating the wiring pattern with a solder resist, oxidation of the wiring board 10 can be suppressed.

In the case of using a ceramic as the material of the wiring board 10, for example, a refractory metal which can be baked simultaneously with the ceramic of the wiring board 10 may be chosen as the material of the conductor wiring layer. For example, the conductor wiring layer may be made of a refractory metal such as tungsten or molybdenum. The conductor wiring layer may have a multilayer structure. For example, the conductor wiring layer may include: a pattern of refractory metal which is formed by the aforementioned method; and a metal layer containing another metal (e.g., nickel, gold, or silver) that is formed on this pattern via plating, sputtering, vapor deposition, etc.

(Light-Emitting Element 20)

Figure 2A:
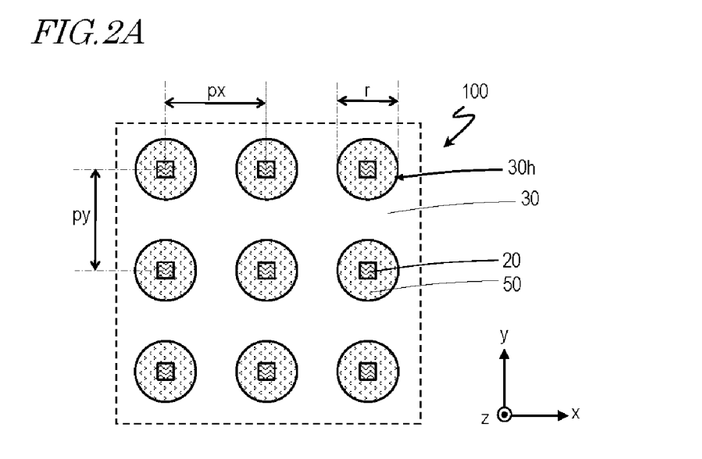
FIG. 2A is a schematic upper plan view showing an example of a structure remaining after a wavelength converting member is removed from the light emission device 100 according to an embodiment.

The plurality of light-emitting elements 20 are disposed at the upper face 10a side of the wiring board 10, and is electrically connected to the first conductor wiring layer 12a. FIG. 2A is an upper plan view showing an example of a structure remaining after the wavelength converting member 61 is removed from the light emission device 100. In FIG. 2A, attention is paid to 3×3 light-emitting elements 20, these being enlarged in illustration.

On the upper face 10a of the wiring board 10, the plurality of light-emitting elements 20 may be arranged in a linear or two-dimensional array. In the present embodiment, the plurality of light-emitting elements 20 are arranged in a two-dimensional array along two orthogonal directions, i.e., the x direction and the y direction, such that an arrangement pitch px along the x direction and an arrangement pitch py along the y direction are equal. Herein, an "arrangement pitch of light-emitting elements" means a distance between optical axes of two adjacent light-emitting elements.

If the arrangement pitch is too large, the luminance efficiency may significantly deteriorate. According to a study by the inventors, for example, the arrangement pitches px and py are preferably not less than 0.5 mm and not more than 10.0 mm. From the standpoint of improving luminance efficiency, it is further preferable that the arrangement pitches px and py are each not less than 0.5 mm and not more than 2.0 mm. However, the directions of arrangement and arrangement pitches are not limited to these examples. There may be different arrangement pitches along the x direction and along the y direction, and the two directions of arrangement may not be orthogonal. Moreover, each of the arrangement pitches px and py does not need to be a constant pitch, but may be a variable pitch. For example, the plurality of light-emitting elements 20 may be arranged so that their interspace expands from the center of the wiring board 10 toward the periphery.

The light-emitting elements 20 are semiconductor light-emitting elements. Any known light-emitting element, such as a semiconductor laser or a light-emitting diode may be used as each light-emitting element 20. In the present embodiment, light-emitting diodes will be exemplified as the light-emitting elements 20. As the light-emitting elements 20, elements that emit light of any desired wavelengths can be chosen. For example, a light-emitting element to emit light of a blue or green wavelength may be an element in which ZnSe, a nitride-based semiconductor ($In_xAl_yGa_{1-x-y}N$, $0 \leq X$, $0 \leq Y$, $X+Y \leq 1$), or GaP is used. A light-emitting element emitting light of a red wavelength may be a semiconductor light-emitting element containing GaAlAs, AlInGaP, or other semiconductors. Furthermore, semiconductor light-emitting elements that are made of any other materials than the above may also be used. The compositions, emission colors, sizes, numbers, etc., of light-emitting elements to be used may be appropriately chosen, depending on the purpose and design specifications.

Each light-emitting element 20 preferably contains a nitride semiconductor ($In_xAl_yGa_{1-x-y}N$, $0 \leq X$, $0 \leq Y$, $X+Y \leq 1$) that is capable of emitting light of a short wavelength. As a result, the wavelength converting member 61, which belongs to a translucent laminate 60 described below, can be efficiently excited. The emission wavelength can be selected based on the material and/or composition of the semiconductor layer. Positive and negative electrodes may be provided on the same face, or on different faces, of each light-emitting element 20.

Each light-emitting element 20 includes, for example, a light-transmitting substrate and a semiconductor multilayer structure that is layered on the substrate. The semiconductor multilayer structure includes an active layer, and an n type semiconductor layer and a p type semiconductor layer sandwiching the active layer, with an n-side electrode and a p-side electrode being electrically connected respectively to the n type semiconductor layer and the p type semiconductor layer. Each light-emitting element 20 includes: an upper face (or outgoing face) 20a through which light is emitted and a lower face 20b that is located on an opposite side to the upper face 20a. In the present embodiment, the n-side electrode and the p-side electrode are located on the lower face 20b.

The n-side electrode and the p-side electrode of each light-emitting element 20 are electrically connected and fixed on the first conductor wiring layer 12a, which is provided on the upper face 10a of the wiring board 10. In the present embodiment, the wiring board 10 is an FPC, and the light-emitting elements 20 is directly mounted on the wiring board 10.

Each light-emitting element 20 may include a lens or the like to broaden the outgoing angle of light going out from the upper face 20a. In the present embodiment, a height h along the z direction taken from the upper face 10a of the wiring board 10 to the upper face 20a of the light-emitting element 20 may be e.g. about 0.155 mm. Alternatively, an height h7 along the z direction taken from the upper face of the first conductor wiring layer 12a of the wiring board 10 to the upper face 20a of the light-emitting element 20 may be e.g. about 0.205 mm.

(First Light Diffusing Member 30)

The first light diffusing member 30 is disposed on the wiring board 10. The first light diffusing member 30 has a plurality of throughholes 30h, and contains a light-diffusive material. Each of the plurality of light-emitting elements 20 is disposed in a corresponding one of the plurality of throughholes 30h. In the present embodiment, a thickness h3 of the first light diffusing member 30 may be e.g. about 0.30 mm.

The first light diffusing member 30 is of such nature that it diffuses incident light and transmits the light. The first light diffusing member 30 is made of a material which allows little light absorption with respect to visible light, e.g., a polycarbonate resin, a polystyrene resin, an acrylic resin, or a polyethylene resin. It is possible to control the degree of light diffusion by: providing ruggednesses on the surface of the first light diffusing member 30; dispersing a light-diffusive material of a different refractive index in the first light diffusing member 30; or varying the particle size of the light-diffusive material. As the light-diffusive material, silicon oxide, zirconium oxide, titanium oxide, or other high-refractive index materials can be used. As the light diffusing member, what is commercially available as a light-diffusing sheet, a diffuser film, or any other name can be used.

Figure 2B:
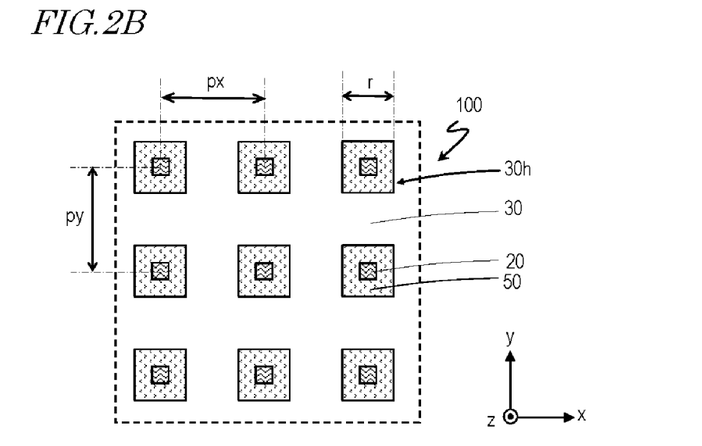
FIG. 2B is a schematic upper plan view showing another example of a structure remaining after a wavelength converting member is removed from the light emission device 100 according to an embodiment.

As shown in FIG. 2A in plan view, an example shape of each throughhole 30h is a circle. However, without being limited to this shape, each throughhole 30h may be a rectangle as shown in FIG. 2B, or an oval, including an ellipse or an oblong shape. For example, in the case where the shape of each throughhole 30h is a circle, its diameter r may be about 0.50 mm. FIG. 2B shows an exemplary structure of the first light diffusing member 30 whose throughholes 30h have square shapes. For example, the arrangement pitch px along the x direction and the arrangement pitch py along the y direction may be equal, such that each arrangement pitch is not less than 0.5 mm and not more than 10.0 mm. Moreover, the length r of one side of each throughhole 30h may be about 1.0 mm. However, the directions of arrangement and arrangement pitches are not limited to these examples. The plurality of throughholes 30h may be provided on the first light diffusing member 30 in any appropriate manner according to the particular arrangement of the plurality of light-emitting elements 20. As mentioned above, the two directions of arrangement do not need to be orthogonal. Each arrangement pitch, indicating the distance between centers of two adjacent throughholes 30h, does not need to be a constant pitch, but may be a variable pitch.

(First Light Reflecting Layer 40)

The first light reflecting layer 40 is located between the wiring board 10 and the first light diffusing member 30. As the light reflecting layer, a highly-reflective film having a multilayer film structure, which may be made of e.g. a polyester-based resin, is used. In the case where a highly-reflective film is used as the light reflecting layer, the film preferably has throughholes corresponding to the throughholes 30h of the first light diffusing member 30. A highly-reflective film has a high reflectance in a wavelength range defining a visible light region (e.g. 400 nm to 800 nm). It is preferable that the highly-reflective film has a reflectance as high as e.g. 98% or more in this wavelength range. For example, a reflective film available from 3M (ESR 80v2) can be suitably used as the highly-reflective film. However, without being limited to a highly-reflective film, the first light reflecting layer 40 may be a metal film, or a multilayer dielectric film. In the present embodiment, the thickness h2 of the first light reflecting layer 40 may be e.g. about 0.065 mm.

The first light reflecting layer 40 reflects incident light toward the first light diffusing member 30. By providing the first light reflecting layer 40 between the upper face 10a of the wiring board 10 and the lower face 30b of the first light diffusing member 30, light traveling toward the lower face 30b of the first light diffusing member 30 is allowed to be reflected by the first light reflecting layer 40. This provides for an improved efficiency of utilization of light which is emitted from the light-emitting elements 20. In particular, losses of optical energy upon reflect can be minimized by using a highly-reflective film as the light reflecting layer, whereby luminance of the light emission device 100 can be improved.

(Second Light Diffusing Member 50)

The plurality of second light diffusing members 50 cover the plurality of light-emitting elements 20, and are disposed in the plurality of throughholes 30h of the first light diffusing member 30. In the throughhole 30h, each second light diffusing member 50 is in contact with an inner surface 30s of the throughhole 30h, a side surface 40c of the first light reflecting layer 40, a portion of the upper face 10a of the wiring board 10, and the upper face 20a, the lower face 20b, and the side surface 20c of the light-emitting element 20. In other words, the second light diffusing member 50 fills the throughhole 30h in such a manner as to cover the light-emitting element 20 and be in contact with the inner surface 30s of the throughhole 30h, the side surface 40c of the first light reflecting layer 40, and a portion of the upper face 10a of the wiring board 10. However, partial or local voids may be formed along a boundary between: the inner surface 30s of the throughhole 30h and/or the side surface 40c of the first light reflecting layer 40; and the second light diffusing member 50. Such voids may occur for reasons associated with manufacturing, for example. As will be specifically described later, another light reflecting layer which is distinct from the first light reflecting layer 40 may be located between the upper face 10a of the wiring board 10 and the plurality of second light diffusing members 50.

Similarly to the first light diffusing member 30, the second light diffusing members 50 may be made of a material which allows little light absorption with respect to visible light, e.g., a polycarbonate resin, a polystyrene resin, an acrylic resin, or a polyethylene resin, for example. The second light diffusing members 50 contain a light-diffusive material. As the light-diffusive material, a high-refractive index material (or fine particles having a high refractive index) can be used, e.g., silicon oxide, zirconium oxide, or titanium oxide. For example, a material to be used for the second light diffusing members 50 can be obtained by mixing a high-refractive index material in an acrylic resin material. Herein, a content ratio a, which the light-diffusive material accounts for in the second light diffusing members 50 is higher than a content ratio b, which the light-diffusive material accounts for in the first light diffusing member 30. The content ratio a is preferably not less than 1.5 times the content ratio b and not more than 3.0 times the content ratio b. Based on this relationship between the content ratios, light emitted from each light-emitting element 20 is allowed to undergo diffuse reflection at the second light diffusing member 50, whereby the reflected light is guided to the first light diffusing member 30.

(Second Light Reflecting Layer 55)

Figure 7A:
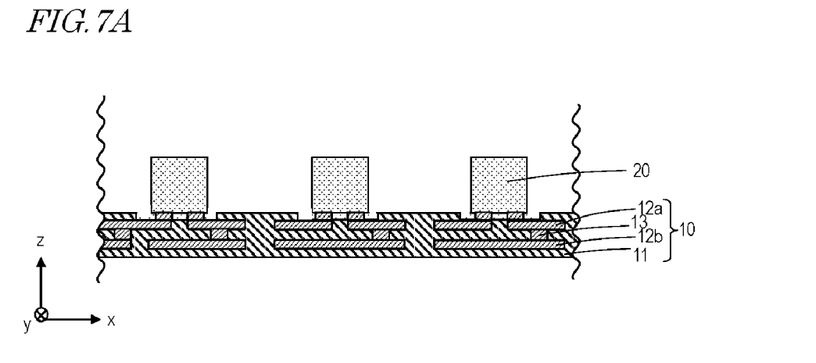
FIG. 7A is a step-by-step cross-sectional view showing a production step in a production method of the light emission device 100.
Figure 7B:
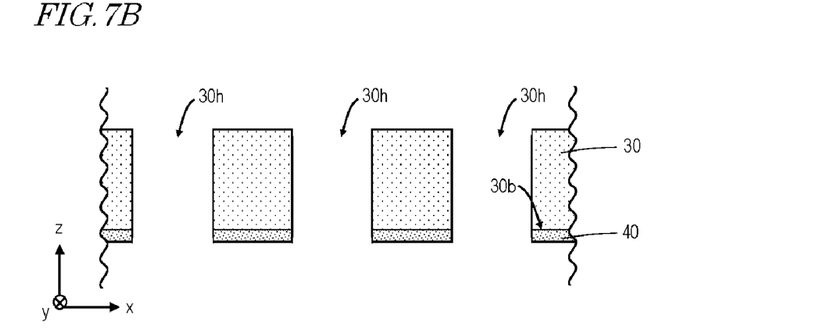
FIG. 7B is a step-by-step cross-sectional view showing a production step in a production method of the light emission device 100.
Figure 7C:
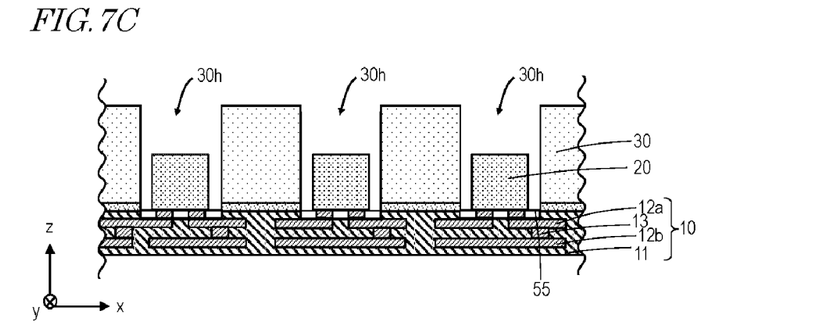
FIG. 7C is a step-by-step cross-sectional view showing a production step in a production method of the light emission device 100.
Figure 7D:
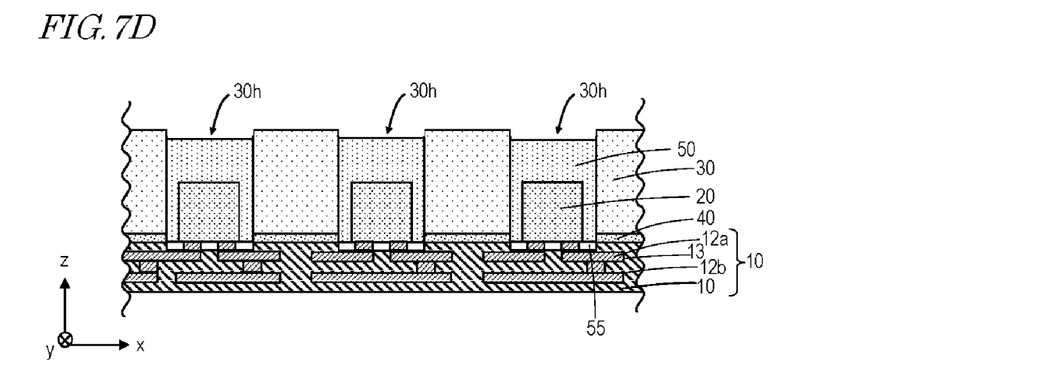
FIG. 7D is a step-by-step cross-sectional view showing a production step in a production method of the light emission device 100.
Figure 7E:
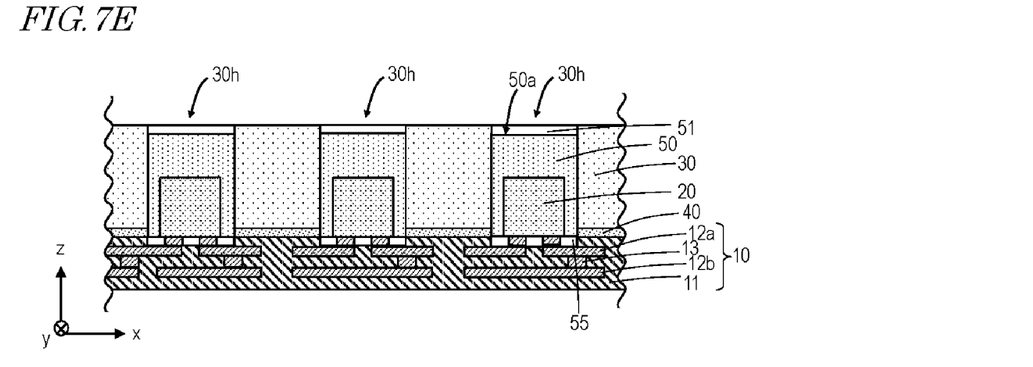
FIG. 7E is a step-by-step cross-sectional view showing a production step in a production method of the light emission device 100.
Figure 7F:
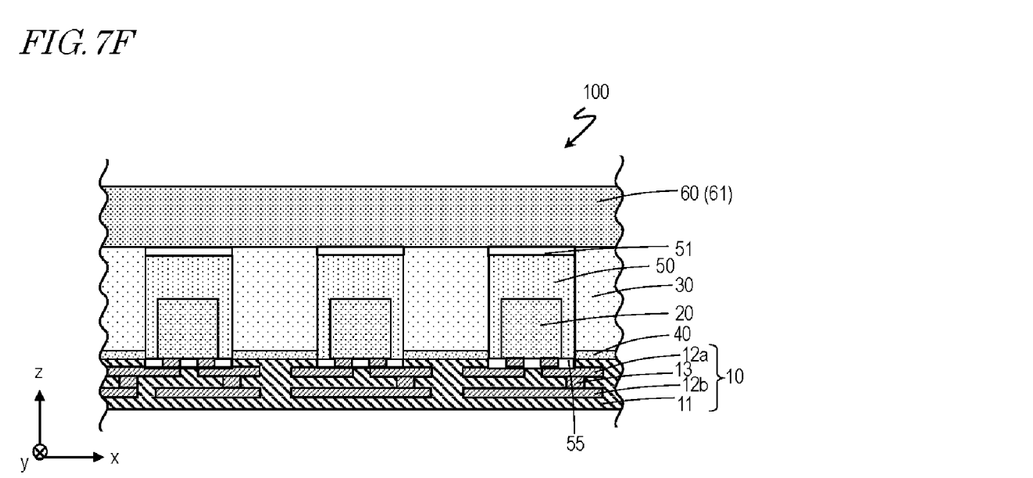
FIG. 7F is a step-by-step cross-sectional view showing a production step in a production method of the light emission device 100.

As shown in FIG. 7F, the light emission device 100 may further include a second light reflecting layer 55 located between the wiring board 10 and the plurality of second light diffusing members 50. The second light reflecting layer 55 may be made of the same material as the third light reflecting layer 51. Thus, by providing a light reflecting layer at the rear face side of each light-emitting element 20, light traveling toward the upper face 10a of the wiring board 10 can be reflected by the light reflecting layer, so as to be guided into the second light diffusing member 50. This allows for a further improvement in the utilization efficiency of light which is emitted from the light-emitting element 20.

(Third Light Reflecting Layer 51)

The third light reflecting layer 51 is located between the plurality of second light diffusing members 50 and the wavelength converting member 61 (described later). The third light reflecting layer 51 covers the plurality of second light diffusing members 50 disposed in the plurality of throughholes 30h of the first light diffusing member 30, and fills the opening 30f of each of the plurality of throughholes 30h. In the present embodiment, a height h8 along the z direction from the upper face 20a of each light-emitting element 20 to the opening 30f of the throughhole 30h may be e.g. about 0.210 mm.

The third light reflecting layer 51 is made of a material which contains a resin and particles of reflective material that are dispersed in the resin, the particles being oxide particles, e.g., titanium oxide, aluminum oxide, or silicon oxide. The oxide particles may have an average particle size of e.g. about not less than 30 nm and not more than 250 nm. The third light reflecting layer 51 may further contain a pigment, a light-absorbing material, a phosphor, or the like. As the resin material, a photocurable resin whose main component is an acrylate, an epoxy, a silicone, or the like may be used. The particles of reflective material that cause scattering of light in the third light reflecting layer 51 may be uniformly distributed, or distributed at higher densities in regions in which the light distribution angle of each light-emitting element 20 has smaller absolute values than in regions with greater absolute values of light distribution angle.

By providing the third light reflecting layer 51 at a position immediately above each light-emitting element 20, light travelling immediately above the light-emitting element 20 can be effectively diffused by the third light reflecting layer 51 into the plane of the second light diffusing member 50, thus improving the luminance in regions other than immediately above the light-emitting element 20. In other words, unevenness in luminance on the upper face of the light emission device 100 can be effectively suppressed, thus providing for more uniform light.

The light emission device 100 includes a translucent laminate 60 having the wavelength converting member 61. In plan view, the translucent laminate 60 has an essentially plate-like shape.

(Wavelength Converting Member 61)

The wavelength converting member 61 is disposed on the first light diffusing member 30 and the plurality of second light diffusing members 50. The wavelength converting member 61 contains a wavelength converting material that converts light which is emitted by the light-emitting elements 20 into light of a different wavelength. The wavelength converting member 61 is typically obtained by dispersing particles of a phosphor in a light-transmitting matrix, e.g., a resin. Alternatively, a sintered piece of phosphor or the like may be used as the wavelength converting member 61. The wavelength converting member 61 absorbs at least a portion of light going out from each light-emitting element 20, and emits light of a wavelength different from the wavelength of the light emitted from the light-emitting element 20. For example, the wavelength converting member 61 may convert the wavelength of a portion of blue light from the light-emitting element 20, thus emitting yellow light. With such a structure, white light can be obtained via intermixing of colors between blue light having passed through the wavelength converting member 61 and yellow light emitted by the wavelength converting member 61. In the present embodiment, the thickness h4 of the wavelength converting member 61 may be e.g. about 0.1 mm.

As the resin in which particles of phosphor, etc., are to be dispersed, the following may be used: silicone resins, modified silicone resins, epoxy resins, modified epoxy resins, urea resins, phenolic resins, acrylic resins, urethane resins, or fluoroplastics; or any resin that contains two or more kinds of such resins. From the standpoint of efficiently introducing light through the first light diffusing member 30, it would be advantageous for the matrix of the wavelength converting member 61 to have a higher refractive index than does the material of the first light diffusing member 30. By dispersing a material of a different refractive index from that of the matrix into the material of the wavelength converting member 61, a light diffusion function may be conferred to the wavelength converting member 61. For example, particles of titanium oxide, silicon oxide, or the like may be dispersed in the matrix of the wavelength converting member 61.

Known materials are applicable as the phosphor. Examples of phosphors include: fluoride-based phosphors, e.g., KSF type phosphors; nitride-based phosphors, e.g., CASN; YAG type phosphors; β-SiAlON phosphors; and the like. YAG type phosphors are examples of wavelength converting materials which convert blue light into yellow light; KSF type phosphors and CASN are examples of wavelength converting materials which convert blue light into red light; and βSiAlON phosphors are examples of wavelength converting materials which convert blue light into green light. The phosphor may be a quantum dot phosphor.

The wavelength converting member 61 may contain wavelength converting materials which respectively convert blue light into red light and green light, for example. In that case, the light emission device 100 may allow blue light which is emitted from the light-emitting element 20 to be transmitted through the wavelength converting member 61, thereby mixing red, blue, and green light into white light for emission. Alternatively, the plurality of light-emitting elements 20 may include two or more kinds of light-emitting elements 20. The plurality of light-emitting elements 20 may include, for example: light-emitting elements which emit light of a blue wavelength; light-emitting elements which emit light of a green wavelength; and light-emitting elements which emit light of a red wavelength. In that case, the light emission device 100 may mix red, blue, and green light and allow them to be transmitted through the wavelength converting member 61, thus being able to emit white light. Furthermore, the types of light-emitting elements to be used in the light emission device 100 may be determined from the standpoint of enhancing color rendering of the light which is emitted from the light emission device 100.

(Prism Array Layers 62 and 63)

The translucent laminate 60 may further include prism array layers 62 and 63. Each of the prism array layers 62 and 63 is structured so that a plurality of prisms extending along a predetermined direction are arranged. For example, in FIG. 3, the prism array layer 62 may include a plurality of prisms extending along the y direction, while the prism array layer 63 may include a plurality of prisms extending along the x direction. In the present specification, a structure in which such prism array layers 62 and 63 are stacked will be referred to as a "prism sheet". Each of the prism array layers 62 and 63 refracts light, which may enter from various directions, into a direction (the z direction) heading for a display panel (not shown) that is opposed to the light emission device 100. As a result of this, light that goes out from an upper face 60a of the translucent laminate 60, which defines a light-emitting plane of the light emission device 100, mainly contains a component that is perpendicular to the upper face 60a (i.e., parallel to the z axis), thereby enhancing the luminance of the light emission device 100 when viewed from the front (the z direction). As the prism array layers 62 and 63, a wide variety of commercially-available optic elements for backlights can be used. In the present embodiment, the thickness h5 and h6 of the prism array layers 62 and 63 may be, respectively, e.g. about 0.07 mm and about 0.09 mm.

Figure 3:
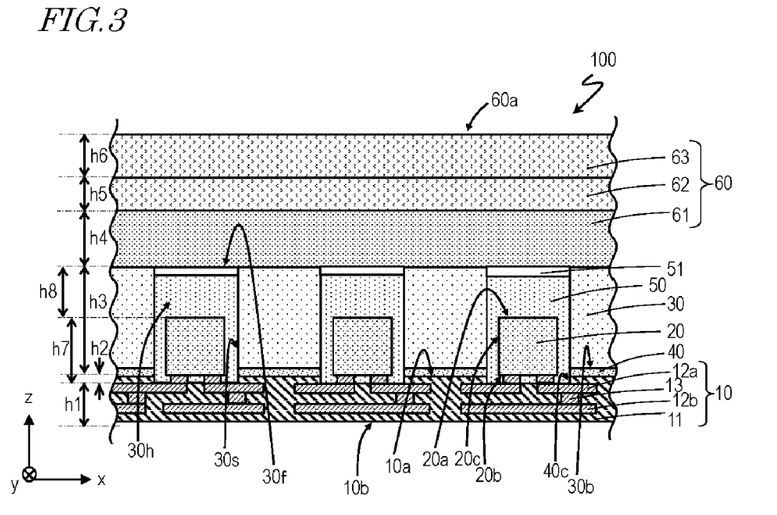
FIG. 3 is a schematic cross-sectional view showing an example structure of a variation of the light emission device 100 according to the present embodiment.

The light emission device 100 may further include a reflection-type polarization layer (not shown) located above the prism array layer 63. The reflection-type polarization layer selectively transmits light of a polarization direction that matches the polarization direction of a polarizer which is disposed at the backlight side of the display panel (e.g. a liquid crystal display panel), and reflects polarized light of a polarization direction which is perpendicular to that polarization direction toward the prism array layers 62 and 63. A portion of the polarized light which has returned from the reflection-type polarization layer will have its polarization direction changed when it is again reflected by the prism array layers 62 and 63, the wavelength converting member 61, and the first light diffusing member 30. This portion of light will be converted into polarized light having the polarization direction of the polarizer of the liquid crystal display panel, again enter the reflection-type polarization layer, and go out toward the display panel. As a result, the polarization direction of the light emitted from the light emission device 100 can be made uniform, thus allowing light of a polarization direction that is effective for enhancing the luminance of the display panel to be provided with a high efficiency.

Figure 4:
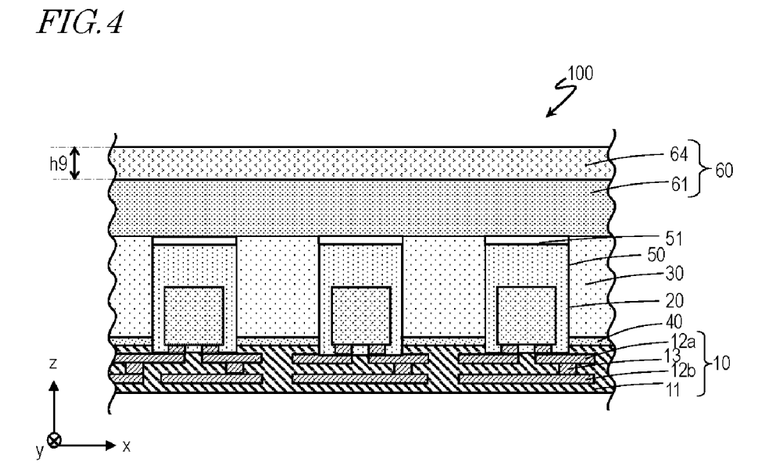
FIG. 4 is a schematic cross-sectional view showing another example structure of a variation of the light emission device 100 according to the present embodiment.

As shown in FIG. 4, the translucent laminate 60 may include a prism sheet 64 which is in sheet form and structured so that two prism array layers are stacked therein. In the present embodiment, the thickness h9 of the prism sheet 64 may be about 0.08 mm. Thus, the thickness h9 of the prism sheet 64 can be kept at approximately a half of the thicknesses (h5+h6) of the prism sheets of the case where the prism array layers 62 and 63 are merely stacked. As the prism sheet 64, Advanced Structured Optical Composite (ASOC) available from 3M can be used, for example.

Adopting the prism sheet 64 allows the light emission device 100 to be made even thinner. Such a thin-profiled light emission device 100 will be particularly useful for smartphones and other applications.

In the light emission device 100 according to the present embodiment, the first light diffusing member 30 functions both as a light guide plate and as a light diffusing member, thus making it unnecessary to provide a light diffusing member which would conventionally have been located above the first light diffusing member 30. As described above, the thickness of the light emission device 100 can be made 0.8 mm or less, thus promoting thinness of the light emission device.

In recent years, the required specifications for smartphones, etc., on the market would stipulate a height of 1.5 mm or less, and some very stringent specifications may require a height of e.g. not less than 0.5 mm and not more than 1.0 mm. The light emission device 100 according to the present embodiment well satisfies such requirements. Furthermore, by allowing light which is emitted from each light-emitting element 20 to be guided to the surrounding first light diffusing member 30 through the second light diffusing member 50 covering the light-emitting element 20, unevenness in the luminance of the light which is emitted from the light emission device 100 can be adequately suppressed.

Figure 5:
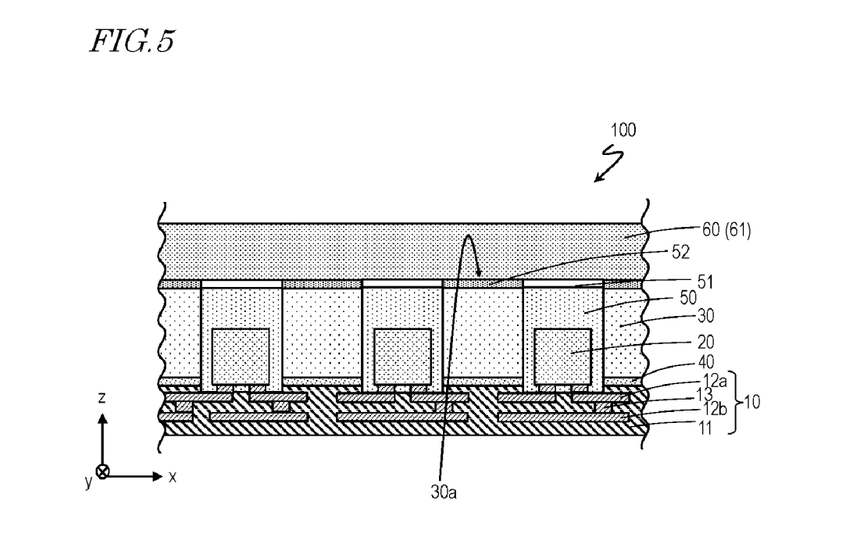
FIG. 5 is a schematic cross-sectional view showing another example structure of a variation of the light emission device 100 according to the present embodiment.
Figure 6:
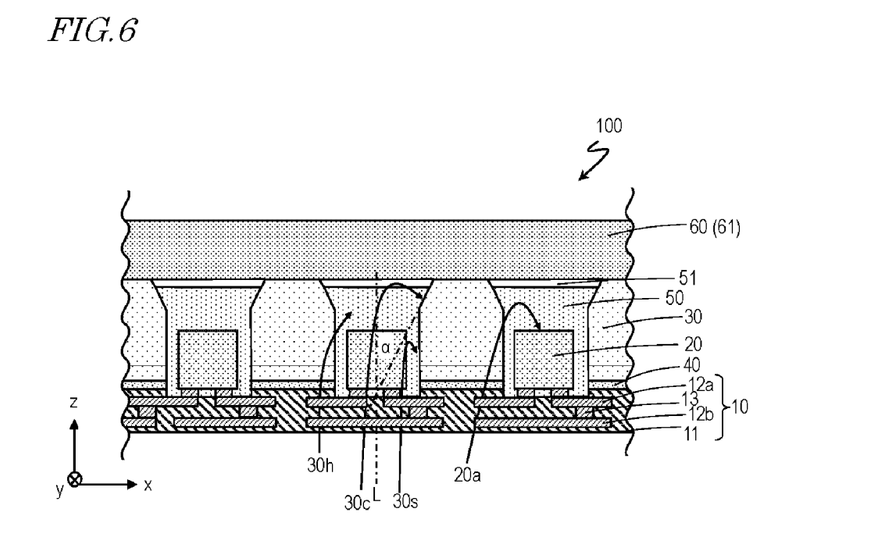
FIG. 6 is a schematic cross-sectional view showing another example structure of a variation of the light emission device 100 according to the present embodiment.

FIG. 5 and FIG. 6 are cross-sectional views each showing an example structure of a variation of the light emission device 100 according to the present embodiment.

As shown in FIG. 5, the light emission device 100 may further include a light diffusing layer 52 that is located between the first light diffusing member 30 and the wavelength converting member 61. For example, a surface treatment such as emboss processing or bead coating may be applied to the upper face 30a of the first light diffusing member 30, thus introducing minute ruggednesses on its surface; as a result, the light diffusing layer 52 can be formed on the upper face 30a of the first light diffusing member 30. Providing the light diffusing layer 52 can bring about a better diffusion effect for light which is emitted from the light-emitting elements 20.

As shown in FIG. 6, the inner surface 30s of each of the plurality of throughholes 30h includes a slope (or sloped portion) 30c which extends upward from a position higher than the upper face 20a of the corresponding one of the plurality of light-emitting elements 20. The slope 30c is inclined by a predetermined angle α with respect to an optical axis L which extends in a perpendicular direction to the upper face 20a of the light-emitting element 20. A portion of the second light diffusing member 50 and the third light reflecting layer 51 are in contact with the slope 30c, and the third light reflecting layer 51 covers the plurality of second light diffusing members 50 disposed in the plurality of throughholes 30h. By adjusting the angle α, it becomes possible to control the degree to which light is diffused in the first light diffusing member 30. The angle α may be set in a range of not less than 5° and not more than 45°, for example. The thickness of the sloped portion 30c along the z direction may be about 0.210 mm, for example.

[2. Production Method for Light Emission Device 100]

With reference to FIGS. 7A through 7F, an exemplary production method for the light emission device 100 will be described. FIGS. 7A through 7F are step-by-step cross-sectional views for describing production steps in the production method for the light emission device 100.

As shown in FIG. 7A, the light-emitting elements 20 are mounted on the wiring board 10, which is an FPC. By directly mounting the light-emitting elements on the wiring board, reliability of LED mounting is ensured, and variations in wiring resistance can be reduced. As a result, unevenness in the luminance of the light emission device 100 that may be ascribable to this or other reasons can be reduced.

The first light diffusing member 30 having the plurality of throughholes 30h as shown in FIG. 7B is produced. A thin-profiled light emission device having a thickness of about 0.8 mm would need a light diffusing member having a thickness of about 0.3 mm. In this exemplary production method, first, e.g. Al is allowed to adhere to the surface of the light diffusing member by vapor deposition, thereby forming a light reflecting layer. The light reflecting layer can also be formed by methods such as attaching a light reflecting layer in sheet form, or applying a resin in which a reflective material is dispersed. Thereafter, a double sided tape is attached to the resultant light reflecting layer, thereby forming an adhesion layer. Thereafter, through pressing, a plurality of throughholes are made in the light diffusing member. Finally, the light diffusing member is cut into a predetermined outer size, whereby the first light diffusing member 30 (hereinafter referred to as a "diffusion sheet") having the first light reflecting layer 40 formed on the lower face 30b, and having the plurality of throughholes 30h therein, is obtained. Thus, by integrally forming the first light diffusing member 30 and the first light reflecting layer 40, the production steps are simplified, whereby the production cost can be reduced.

As shown in FIG. 7C by using a vacuum laminator, the diffusion sheet is press-fitted onto the wiring board 10 via the adhesion layer. While being aligned so that the plurality of light-emitting elements 20 are respectively located in the corresponding ones of the plurality of throughholes 30h, the diffusion sheet is placed on the wiring board 10. Even if a misalignment occurs in the positioning of the diffusion sheet, such a misalignment can be absorbed by the plurality of throughholes 30h. Optical influences can be reduced by adjusting diffusivity (light scattering) of the diffusion sheet.

As shown in FIG. 7C, the second light reflecting layer 55 may be formed so as to fill the voids between the upper face 10a of the wiring board 10 and the lower faces 20b of the light-emitting elements 20. The second light reflecting layer 55 is made of a material that contains a resin and particles of reflective material that are dispersed in the resin, the particles being oxide particles, e.g., titanium oxide, aluminum oxide, or silicon oxide. For example, within the plurality of throughholes 30h, the aforementioned material may be applied so as to cover the upper face 10a of the wiring board 10, which is located at the rear face side of the light-emitting elements 20, whereby the second light reflecting layer 55 is formed. The first light reflecting layer 40 and the second light reflecting layer 55 may be formed as a common layer, by using the same material.

The method for producing the intermediate product of a light emission device as shown in FIG. 7C is not limited to the above-described method. The diffusion sheet may be press-fitted onto the wiring board 10 first. Thereafter, solder paste may be printed on the first conductor wiring layer 12a of the wiring board 10, and the plurality of light-emitting elements 20 may be disposed within the plurality of throughholes 30h, and respective n-side electrodes and respective p-side electrodes of the plurality of light-emitting elements 20 are mounted on the first conductor wiring layer 12a. Thereafter, through a reflow process, the plurality of light-emitting elements 20 may be electrically coupled to the first conductor wiring layer 12a via solder, thereby producing an intermediate product of the light emission device.

As shown in FIG. 7D, for example, the plurality of throughholes 30h may be filled with a diffusion resin so that the second light reflecting layer 55 and the light-emitting elements 20 are covered with the diffusion resin. The diffusion resin may be a material in which a high-refractive index material (e.g., silicon oxide, zirconium oxide, or titanium oxide) is mixed in a material which allows little light absorption with respect to visible light (e.g., a polycarbonate resin, a polystyrene resin, acrylic resin, a polyethylene resin, or a silicone resin). Thereafter, the diffusion resin is cured with ultraviolet irradiation, or through heating.

As shown in FIG. 7E, a material that contains a resin and particles of reflective material that are dispersed in the resin, the particles being oxide particles, e.g., titanium oxide, aluminum oxide, or silicon oxide is applied on the upper faces 50a of the plurality of second light diffusing members 50 to form the third light reflecting layer 51, whereby the plurality of throughholes 30h are completely filled.

As shown in FIG. 7F, the translucent laminate 60 is layered on the diffusion sheet, whose throughholes have been filled with the diffusion resin. For example, the translucent laminate 60 may be secured to the diffusion sheet by laser welding.

The light emission device 100 is obtained through the aforementioned steps.

A light emission device according to the present disclosure is applicable to backlight light sources for liquid crystal displays, various illumination devices, and the like.

While the present invention has been described with respect to exemplary embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A light emission device comprising:
   a wiring board;
   a plurality of light-emitting elements being disposed on the wiring board and electrically connected to a wiring layer of the wiring board;
   a first light diffusing member being disposed on the wiring board, the first light diffusing member having a plurality of throughholes and each of the plurality of light-emitting elements being disposed in a corresponding one of the plurality of throughholes, wherein the first light diffusing member comprises a polymeric resin containing light-diffusive particles formed from a refractive material;
   a plurality of second light diffusing members covering the plurality of light-emitting elements and being disposed in the plurality of throughholes, wherein each second light diffusing member comprises a polymeric resin containing light-diffusive particles formed from a refractive material, such that a content ratio of the light-diffusive particles in each second light diffusing member is higher than a content ratio of the light-diffusive particles in the first light diffusing member;
   a wavelength converting member disposed on the first light diffusing member and the plurality of second light diffusing members; and
   a third light reflecting layer located between the plurality of second light diffusing members and the wavelength converting member.

2. The light emission device of claim 1, further comprising a first light reflecting layer located between the wiring board and the first light diffusing member.

3. The light emission device of claim 2, further comprising a second light reflecting layer located between the wiring board and the plurality of second light diffusing members.

4. The light emission device of claim 3, further comprising a light diffusing layer located between the first light diffusing member and the wavelength converting member.

5. The light emission device of claim 4, wherein an inner surface of each of the plurality of throughholes comprises a slope extending upward from a position higher than an upper face of a corresponding one of the plurality of light-emitting elements.

6. The light emission device of claim 5, further comprising a prism sheet located above the wavelength converting member.

7. The light emission device of claim 1, further comprising a second light reflecting layer located between the wiring board and the plurality of second light diffusing members.

8. The light emission device of claim 1, further comprising a light diffusing layer located between the first light diffusing member and the wavelength converting member.

9. The light emission device of claim 1, wherein an inner surface of each of the plurality of throughholes comprises a slope extending upward from a position higher than an upper face of a corresponding one of the plurality of light-emitting elements.

10. The light emission device of claim 1, further comprising a prism sheet located above the wavelength converting member.

* * * * *